(12) United States Patent
Lee et al.

(10) Patent No.: US 9,516,740 B2
(45) Date of Patent: Dec. 6, 2016

(54) ELECTRONIC COMPONENT EMBEDDED SUBSTRATE AND METHOD FOR MANUFACTURING ELECTRONIC COMPONENT EMBEDDED SUBSTRATE

(71) Applicant: Samsung Electro-Mechanics Co., Ltd., Suwon (KR)

(72) Inventors: Doo Hwan Lee, Daejeon (KR); Tae Kyun Bae, Yeongi-gun (KR); Ho Shik Kang, Yeongi-gun (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 229 days.

(21) Appl. No.: 14/108,517

(22) Filed: Dec. 17, 2013

(65) Prior Publication Data

US 2015/0062848 A1    Mar. 5, 2015

(30) Foreign Application Priority Data

Aug. 29, 2013  (KR) .................. 10-2013-0103276

(51) Int. Cl.
H05K 1/18    (2006.01)
H05K 1/02    (2006.01)
(Continued)

(52) U.S. Cl.
CPC ............ H05K 1/0271 (2013.01); H01L 24/19 (2013.01); H01L 24/25 (2013.01); H05K 1/185 (2013.01);
(Continued)

(58) Field of Classification Search
CPC ...... H05K 3/284; H05K 7/142; H05K 1/0306; H05K 1/0231; H05K 1/144; H05K 3/3447; H05K 1/141; H05K 3/3452; H05K 1/189; H05K 1/118; H05K 2201/2009; H05K 3/0058; H05K 1/147; H05K 3/281; H01L 2924/01079; H01L 2924/01078; H01L 2224/48091; H01F 21/02; C01B 21/068
(Continued)

(56) References Cited

U.S. PATENT DOCUMENTS 6,734,542 B2 *   5/2004  Nakatani ............. H01L 21/4857
                                                      174/255
7,936,567 B2 *   5/2011  Takashima .......... H01L 21/4857
                                                      174/261
(Continued)

FOREIGN PATENT DOCUMENTS

JP    2000-261124    9/2000
JP    2011-187830    9/2011
(Continued)

OTHER PUBLICATIONS

Korean Office Action issued Jun. 27, 2014 in corresponding Korean Patent Application No. 10-2013-0103276.
(Continued)

*Primary Examiner* — Jeremy C Norris
*Assistant Examiner* — Roseline Alicea Rivera
(74) *Attorney, Agent, or Firm* — NSIP Law

(57) ABSTRACT

The present invention can reduce warpage while minimizing unnecessary wiring of an electronic component embedded substrate by including an electronic component; a first wiring layer; and a second wiring layer, wherein at least one of the number of layers and wiring density of the first wiring layer is greater than at least one of the number of layers and wiring density of the second wiring layer and a first insulating portion is made of a material having a lower coefficient of thermal expansion than a second insulating portion.

31 Claims, 10 Drawing Sheets

(51) Int. Cl.
  *H05K 3/46* (2006.01)
  *H01L 23/00* (2006.01)
(52) U.S. Cl.
  CPC ... *H05K 3/4697* (2013.01); *H01L 2224/04105* (2013.01); *H01L 2224/0557* (2013.01); *H01L 2224/06181* (2013.01); *H01L 2224/12105* (2013.01); *H01L 2224/16227* (2013.01); *H01L 2224/16235* (2013.01); *H01L 2224/16237* (2013.01); *H01L 2224/2518* (2013.01); *H01L 2224/32225* (2013.01); *H01L 2224/32245* (2013.01); *H01L 2224/73267* (2013.01); *H01L 2224/83005* (2013.01); *H01L 2224/92244* (2013.01); *H05K 2201/068* (2013.01); *Y10T 29/49139* (2015.01); *Y10T 156/10* (2015.01)

(58) Field of Classification Search
  USPC ............ 361/748, 750, 760–764, 766, 361/782–784, 790, 795, 812; 257/773; 174/250–266
  See application file for complete search history.

(56) References Cited

U.S. PATENT DOCUMENTS 8,183,465 B2 * 5/2012 Suzuki ............... H01L 21/4857 174/250
8,829,356 B2 * 9/2014 Hsu ................... H01L 23/49822 174/257
9,184,103 B2 * 11/2015 Lin ..................... H01L 23/3128
2007/0281394 A1 * 12/2007 Kawabe ............. H01L 21/4857 438/118
2012/0006469 A1 1/2012 Inagaki et al.
2015/0359103 A1 * 12/2015 Sano ..................... H05K 1/186 361/761

FOREIGN PATENT DOCUMENTS

| | | |
|---|---|---|
| JP | 2012-212951 A | 11/2012 |
| KR | 10-2010-0123399 | 11/2010 |
| KR | 10-2012-0048409 | 5/2012 |
| WO | WO 2010/101163 A1 | 9/2010 |
| WO | WO 2011/125380 | 10/2011 |

OTHER PUBLICATIONS

Japanese Office Action dated Sep. 9, 2014 in corresponding Japanese Patent Application No. 2014-043573.

Japanese Office Action issued on Mar. 29, 2016, in counterpart Japanese Application No. 2014-43573 (1 page in English, 8 pages in Japanese).

* cited by examiner

ELECTRONIC COMPONENT EMBEDDED SUBSTRATE AND METHOD FOR MANUFACTURING ELECTRONIC COMPONENT EMBEDDED SUBSTRATE

This application claims the foreign priority benefit under 35 U.S.C. Section 119 of Korean Patent Application Serial No. 10-2013-0103276, filed Aug. 29, 2013, which is hereby incorporated by reference in its entirety into this application.

BACKGROUND OF THE INVENTION

1. Field of the Invention

The present invention relates to an electronic component embedded substrate and a method for manufacturing an electronic component embedded substrate.

2. Description of the Related Art

In order to respond to the trend of light, small, high-speed, multifunctional, and high-performance electronic devices, multilayer substrate technologies to form a plurality of wiring layers on a printed circuit board (PCB) have been developed, and furthermore, technologies to embed an electronic component such as an active device or a passive device in a multilayer substrate also have been developed. For example, in Patent Document 1, a PCB, which inserts an electronic component in a cavity and consists of a plurality of layers, and a method of manufacturing the same are disclosed.

Meanwhile, one of the important tasks in the field of the multilayer substrate is to allow an embedded electronic component to efficiently transceive signals including a voltage or a current with external circuits or other devices.

Further, recently, as the trend of high-performance electronic components and the trend of small and thin electronic components and electronic component embedded substrates are intensified, improvement of integration of circuit patterns should be essentially accompanied to connect an external terminal of the electronic component to external wiring while embedding the small electronic component in the thinner and narrower substrate.

Meanwhile, as the electronic component embedded substrate becomes thinner, a bending phenomenon of the substrate has emerged as a serious problem. This bending phenomenon is referred to as so-called warpage. As the electronic component embedded substrate is made of various materials having different coefficients of thermal expansion, the warpage is intensified.

In particular, since the properties of the electronic component embedded in the substrate, such as coefficient of thermal expansion (CTE) and modulus, are very different from those of typical substrate materials or wiring materials, the warpage is intensified unless the electronic component is positioned in the center portion of the substrate. Therefore, in the conventional electronic component embedded substrates, a method of reducing the overall warpage by equalizing the properties and thicknesses of a top wiring layer and a bottom wiring layer to allow the warpage on the top of the electronic component and the warpage on the bottom of the electronic component to conflict with each other when forming the wiring layers on the top and bottom of the electronic component has been mainly applied.

The method like this is also disclosed in Patent Document 2. In Patent Document 2, a technology of disposing a capacitor in the center of a core substrate and building up a circuit pattern layer and an insulating layer in both directions is disclosed.

However, generally, in an active device such as an integrated circuit, a plurality of external terminals are provided on one surface, and no or only a small number of external terminals are provided on the other surface.

When the active device is embedded in the substrate, if the structures of the top and bottom of the electronic component, such as properties and thickness, are symmetrical, since unnecessary wirings are meaninglessly disposed, process efficiency is reduced, substrate materials are unnecessarily wasted, and it is not desirable to slimming of the electronic component embedded substrate.

RELATED ART DOCUMENT

Patent Document

Patent Document 1: U.S. Patent Laid-open Publication No. 2012-0006469
Patent Document 2: Japanese Patent Laid-open Publication No. 2000-261124

SUMMARY OF THE INVENTION

The present invention has been invented in order to overcome the above-described problems and it is, therefore, an object of the present invention to provide an electronic component embedded substrate and a method for manufacturing an electronic component embedded substrate that can minimize unnecessary wiring while reducing warpage.

In accordance with one aspect of the present invention to achieve the object, there is provided an electronic component embedded substrate including: an electronic component including a first surface having a plurality of first external terminals thereon and a second surface opposite to the first surface and made of an insulating material; a first wiring layer provided on the first surface and including a first wiring electrically connected to the first external terminal and a first insulating portion; and a second wiring layer provided on the second surface and including a second wiring and a second insulating portion, wherein at least one of the number of layers and wiring density of the first wiring layer is greater than at least one of the number of layers and wiring density of the second wiring layer, and the first insulating portion is made of a material having a lower coefficient of thermal expansion than the second insulating portion.

At this time, the electronic component embedded substrate may further include a first insulating layer which includes a cavity to insert at least a portion of the electronic component therein and is made of an insulating material.

Further, the first insulating layer may be a core substrate.

Further, the electronic component embedded substrate may further include a through via which passes through the first insulating layer to electrically connect the first wiring layer and the second wiring layer.

Further, a first contact pad may be further provided on an outer surface of the first wiring layer to be electrically connected to the first wiring.

Further, a first solder resist may be further provided on the outer surface of the first wiring layer to expose the first contact pad to the outside.

Further, the electronic component embedded substrate may further include an adhesive member in contact with the second surface of the electronic component.

Further, the electronic component embedded substrate may further include a first metal pattern provided on an outer surface of the adhesive member.

Further, the electronic component embedded substrate may further include a chip component provided on the second wiring layer to be electrically connected to the second wiring layer.

Further, the chip component may be a memory chip, and the electronic component may be an integrated circuit.

Further, a second contact pad may be further provided on an outer surface of the second wiring layer to be electrically connected to the second wiring.

Further, the electronic component embedded substrate may further include a solder ball for electrically connecting the second contact pad and the chip component.

Further, the solder ball may be provided vertically above or below the electronic component.

Further, a second solder resist may be further provided on the outer surface of the second wiring layer to expose the contact pad to the outside.

In accordance with another aspect of the present invention to achieve the object, there is provided an electronic component embedded substrate including: an electronic component including a first surface having a plurality of first external terminals thereon and a second surface opposite to the first surface and having at least one second external terminal thereon; a first wiring layer provided on the first surface and including a first wiring electrically connected to the first external terminal and a first insulating portion; and a second wiring layer provided on the second surface and including a second wiring electrically connected to the second external terminal and a second insulating portion, wherein the number of the second external terminals is less than the number of the first external terminals, at least one of the number of layers and wiring density of the first wiring layer is greater than at least one of the number of layers and wiring density of the second wiring layer, and the first insulating portion is made of a material having a lower coefficient of thermal expansion than the second insulating portion.

At this time, the electronic component embedded substrate in accordance with an embodiment of the present invention may further include a chip component provided on the second wiring layer to be electrically connected to the second wiring layer.

Further, the chip component may be a memory chip, and the electronic component may be an integrated circuit.

Further, a second contact pad may be further provided on an outer surface of the second wiring layer to be electrically connected to the second wiring.

Further, the electronic component embedded substrate may further include a solder ball for electrically connecting the second contact pad and the chip component.

Further, the solder ball may be provided vertically above or below the electronic component.

Further, the electronic component embedded substrate may further include a second solder resist provided on the outer surface of the second wiring layer to expose the second contact pad to the outside.

Further, the first external terminal and the second external terminal may be electrically connected by a through silicon via (TSV) passing through the electronic component.

At this time, the second wiring layer may include a via having one surface in contact with the second external terminal.

Further, the electronic component embedded substrate may further include a second contact pad provided on the outer surface of the second wiring layer to be in contact with the other surface of the via; and a chip component electrically connected to the second contact pad by the solder ball.

Further, the electronic component embedded substrate may further include an adhesive member in contact with the second surface of the electronic component; first metal patterns provided on an outer surface of the adhesive member; at least one via having one surface in contact with each of the first metal patterns; a second contact pad in contact with the other surface of the via; and a chip component electrically connected to the second contact pad by the solder ball, wherein the first metal patterns and the second external terminal may be electrically connected by a second solder ball.

In accordance with another aspect of the present invention to achieve the object, there is provided a method for manufacturing an electronic component embedded substrate including: providing a core substrate which is penetrated by a cavity, has a first wiring pattern on one surface thereof, has a fourth wiring pattern on the other surface thereof, and electrically connects the first wiring pattern and the fourth wiring pattern by a through via; coupling the other surface of an electronic component having a plurality of first external terminals on one surface thereof to an insulating substrate; coupling the core substrate to the insulating substrate to insert the electronic component in the cavity; forming a second insulating layer on the core substrate and the electronic component; forming a plurality of first vias which are in contact with the first wiring pattern and the first external terminal through the second insulating layer, respectively; and forming a second wiring pattern on the second insulating layer, wherein a coefficient of thermal expansion of the insulating substrate is higher than that of the second insulating layer.

At this time, the method for manufacturing an electronic component embedded substrate may further include the steps of forming at least one build-up layer on the second insulating layer; and forming a first contact pad on an outer surface of the build-up layer.

Further, the step of coupling the other surface of the electronic component having the plurality of first external terminals on one surface thereof to the insulating substrate may be performed to couple the insulating substrate and the electronic component in a state in which an adhesive member is formed on the other surface of the electronic component.

Further, the step of coupling the other surface of the electronic component having the plurality of first external terminals on one surface thereof to the insulating substrate may be performed to make a first metal pattern and an adhesive member in contact with each other in a state in which the first metal pattern is formed on the insulating substrate and the adhesive member is formed on the other surface of the electronic component.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 10A to 10I are process cross-sectional views for explaining the method of manufacturing an electronic component embedded substrate in accordance with an embodiment of the present invention, wherein FIG. 10A is a process cross-sectional view showing the state in which an electronic component is coupled to an insulating substrate, FIG. 10B is a process cross-sectional view showing the state in which a core substrate is coupled to the insulating substrate, FIG. 10C is a process cross-sectional view showing the state in which a second insulating layer is provided, FIG. 10D is a process cross-sectional view showing the state in which a second wiring pattern is formed on the second insulating layer, FIG. 10E is a process cross-sectional view showing the state in which a third insulating layer and a third wiring pattern are formed, FIG. 10F is a process cross-sectional view showing the state in which a fourth insulating layer is formed, FIG. 10G is a process cross-sectional view showing the state in which a first contact pad and a second contact pad are formed, FIG. 10H is a process cross-sectional view showing the state in which a first solder resist and a second solder resist are formed, and FIG. 10I is a process cross-sectional view showing the state in which a chip component is coupled.

DETAILED DESCRIPTION OF THE PREFERABLE EMBODIMENTS

Figure 1:
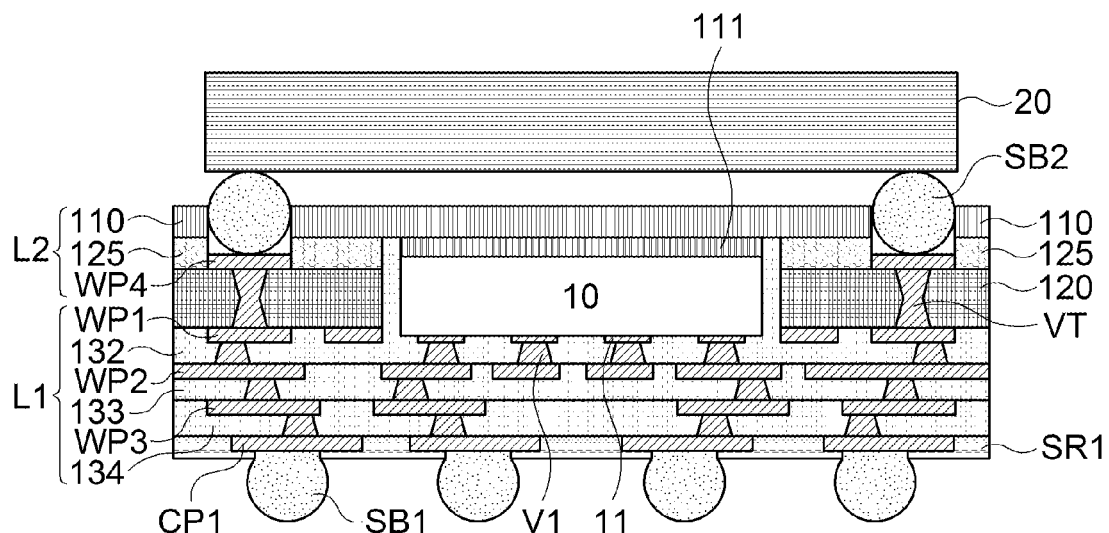
FIG. 1 is a cross-sectional view schematically showing an electronic component embedded substrate in accordance with an embodiment of the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Hereinafter, configurations and operational effects of the present invention will be described in detail with reference to the accompanying drawings.

FIG. 1 is a cross-sectional view schematically showing an electronic component embedded substrate 100 in accordance with an embodiment of the present invention.

Referring to FIG. 1, the electronic component embedded substrate 100 in accordance with an embodiment of the present invention may include an electronic component 10, a first wiring layer L1, and a second wiring layer L2. Furthermore, the electronic component embedded substrate 100 in accordance with an embodiment of the present invention may further include a first insulating layer 120, a first contact pad CP1, a second contact pad CP2, a first solder resist SR1, a first solder ball SB1, a second solder ball SB2, a chip component 20, etc.

The electronic component 10 may have a first external terminal 11 on one surface thereof to be electrically connected to an external device. At this time, at least two first external terminals 11 may be provided. Further, all the surfaces except the surface on which the first external terminal 11 is provided may be made of an insulating material.

Here, the electronic component 10 may be an active device formed of various integrated circuits such as MCU or an application processor (AP).

The first wiring layer L1 may be provided in the direction away from the first external terminals 11 based on the electronic component 10 and include a first wiring and a first insulating portion to perform a function of electrically connecting the first external terminal 11 to other devices inside or outside the substrate.

Further, the second wiring layer L2 may be provided in the direction opposite to the first wiring layer L1 based on the electronic component 10 and include a second wiring and a second insulating portion.

That is, a first wiring pattern WP1, a second insulating layer 132, a second wiring pattern WP2, a third insulating layer 133, a third wiring pattern WP3, and a fourth insulating layer 134, which are shown in FIG. 1, correspond to the first wiring layer L1.

Further, a fourth wiring pattern WP4, a fifth insulating layer 125, and an insulating substrate 10, which are shown in FIG. 1, correspond to the second wiring layer L2.

At this time, among the surfaces of the electronic component 10, an adhesive member 111 may be provided on the surface opposite to the surface having the first external terminals 11 thereon, and the electronic component 10 may be fixed to the insulating substrate 110 through the adhesive member 111. As an example, the adhesive member 111 may be implemented with DAF or an epoxy chip adhesive, and NCP, ACF, etc. also can be used to implement the adhesive member 111.

Meanwhile, as shown, the wiring density of the first wiring layer L1 is higher than that of the second wiring layer L2. That is, the first wiring layer L1 includes the first wiring consisting of vias and wiring patterns which are connected to the first external terminals 11, respectively, but the second wiring layer L2 has no wiring electrically directly connected to the electronic component 10. Thus, the wiring density of the first wiring layer L1 should be relatively high, and the wiring density of the second wiring layer L2 may be relatively low.

As described above, since it is common that all of the external terminals are formed on one surface of the electronic component 10, it is not needed to provide additional wirings on the other surfaces of the electronic component having no external terminals thereon.

Nevertheless, in the prior art, since the wiring layers, which are provided on both sides based on the electronic component 10, are formed symmetrically to prevent warpage, various problems are caused.

However, in the electronic component embedded substrate 100 according to an embodiment of the present invention, only the wiring density of the first wiring layer L1 including the first wiring electrically connected to the first external terminals 11 is implemented high, and the wiring density of the second wiring layer L2 which is an opposite surface of the first wiring layer L1 is implemented low.

In addition, in the electronic component embedded substrate 100 according to an embodiment of the present invention, the first wiring layer L1 is implemented with materials having a low coefficient of thermal expansion, and the second wiring layer L2 is implemented with materials having a high coefficient of thermal expansion.

Accordingly, it is advantageous to formation of wiring with a high wiring density and it is possible to improve accuracy of the wiring and efficiency of a wiring forming process by forming the wiring using materials having a low coefficient of thermal expansion.

Meanwhile, when the high density wiring is formed in a single layer, the spacing between the wirings is too narrow, thus deteriorating reliability. Therefore, it is possible to improve reliability by additionally including a build-up layer to secure the wiring spacing when necessary.

For example, in FIG. 1, compared to the case in which only the second insulating layer 132 and the second wiring pattern WP2 are provided, it is possible to improve process efficiency and reliability by further including the third insulating layer 133, the third wiring pattern WP3, the fourth insulating layer 134, etc. as the build-up layers to secure an extra space in wiring layout when implementing the second wiring pattern WP2, the third wiring pattern WP3, etc.

Further, even when it is needed to form the first wiring layer L1 in more than two layers like this, since the second wiring layer L2 is not needed to include a plurality of build-up layers, it is possible to implement the second wiring layer L2 only by the fifth insulating layer 125 and the insulating substrate 110. Accordingly, it is advantageous to reduction of the entire thickness of the substrate and it is possible to reduce consumption of materials and processes by implementing the second wiring layer L2 as a plurality of layers.

However, when the number of layers of the first wiring layer L1 and the number of layers of the second wiring layer L2 are different, warpage may be intensified. That is, as the first wiring layer L1 side is expanded much and the second wiring layer L2 side is expanded little by heat applied during a manufacturing process, warpage that a peripheral portion of the substrate becomes higher than a center portion of the substrate may occur.

However, in the electronic component embedded substrate 100 according to an embodiment of the present invention, it is possible to effectively reduce the warpage by implementing the second wiring layer L2 with materials having a higher coefficient of thermal expansion than materials forming the first wiring layer L1.

At this time, since the first wiring and the second wiring use metals such as copper and silver having high conductivity by considering electrical connectivity, the difference in the coefficient of thermal expansion thereof is not great. Therefore, it is preferred to adjust the coefficient of thermal expansion of the first wiring layer L1 and the second wiring layer L2 by adjusting the coefficient of thermal expansion of the first insulating portion forming the first wiring layer L1 and the second insulating portion forming the second wiring layer L2.

Meanwhile, the electronic component embedded substrate 100 may further include the first insulating layer 120.

A cavity 122 may be provided in the first insulating layer 120 to insert the electronic component 10 therein, and the first insulating layer 120 may be a core substrate made of a high rigidity material.

At this time, the first wiring pattern WP1 may be formed on one surface of the first insulating layer 120, the second wiring pattern WP2 may be formed on the other surface of the first insulating layer 120, and a through via VT, which electrically connects the first wiring pattern WP1 and the second wiring pattern WP2 through the first insulating layer 120, may be provided in the first insulating layer 120.

Like this, it is possible to further reduce the warpage of the electronic component embedded substrate 100 by including the first insulating layer 120 made of a high rigidity material.

Further, the electronic component embedded substrate 100 according to an embodiment of the present invention may further include the first contact pad CP1, the second contact pad CP2, the first solder resist SR1, the first solder ball SB1, the second solder ball SB2, the chip component 20, etc.

As shown in FIG. 1, the first contact pad CP1 may be formed on the fourth insulating layer 134 and electrically connected to the third wiring pattern WP3 by a via.

Further, the first solder ball SB1 may be provided on an outer surface of the first contact pad CP1 to allow the electronic component embedded substrate 100 to be mounted on another substrate or electrically connected to other devices.

At this time, the first solder resist SR1 may cover a portion of the first contact pad CP1 and the fourth insulating layer 134 and expose a portion of the first contact pad CP1 to the outside, and the first solder ball SB1 may be in contact with the outer surface of the first contact pad CP1 exposed by the first solder resist SR1.

Meanwhile, as shown in FIG. 1, the chip component 20 may be electrically connected to the fourth wiring pattern WP4 by the second solder ball SB2. At this time, the chip component 20 may be various passive devices or active devices and may be a memory chip.

Accordingly, it is possible to implement a high-speed I/O by minimizing a signal transmission path between the electronic component 10 embedded in the electronic component embedded substrate 100 and the chip component 20 in contact with the fourth wiring pattern WP4 by the second solder ball SB2 outside the electronic component embedded substrate 100.

Figure 2:
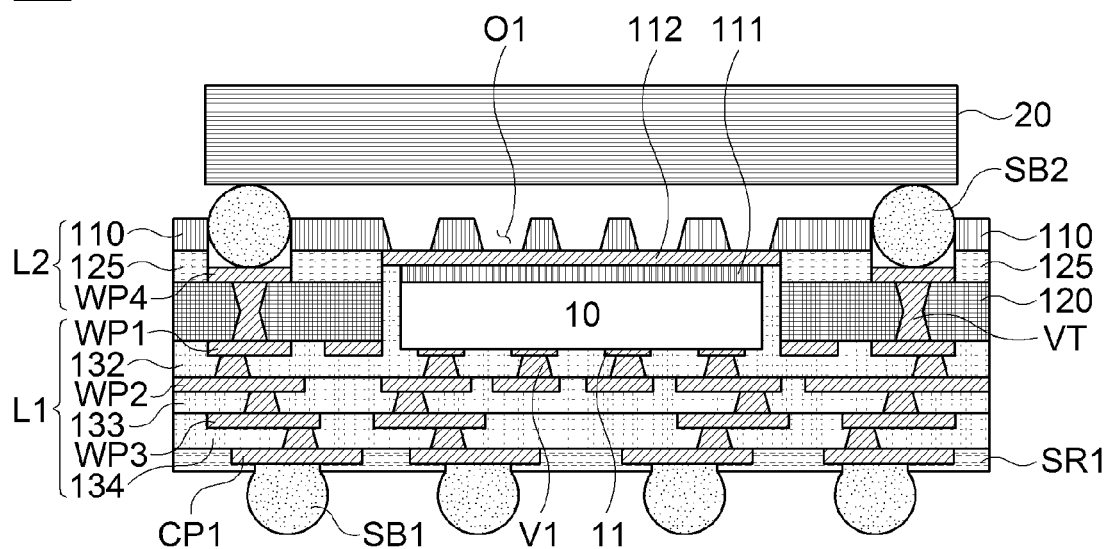
FIG. 2 is a cross-sectional view schematically showing an electronic component embedded substrate in accordance with another embodiment of the present invention.

FIG. 2 is a cross-sectional view schematically showing an electronic component embedded substrate 200 in accordance with another embodiment of the present invention.

Referring to FIG. 2, the electronic component embedded substrate 200 according to the present embodiment is different from the above-described embodiment in that a first metal pattern 112 is provided between an adhesive member 111 and an insulating substrate 110 and a first opening O1 is formed in the insulating substrate 100.

Here, the first metal pattern 112 may perform a function of radiating heat generated from an electronic component 10 to the outside. In this aspect, the first metal pattern 112 may be considered as a heat radiation pattern.

Meanwhile, the first openings O1 may perform a function of exposing the first metal pattern 122 to the outside of the insulating substrate 110, thus improving heat radiation performance of the first metal pattern 112.

Figure 3:
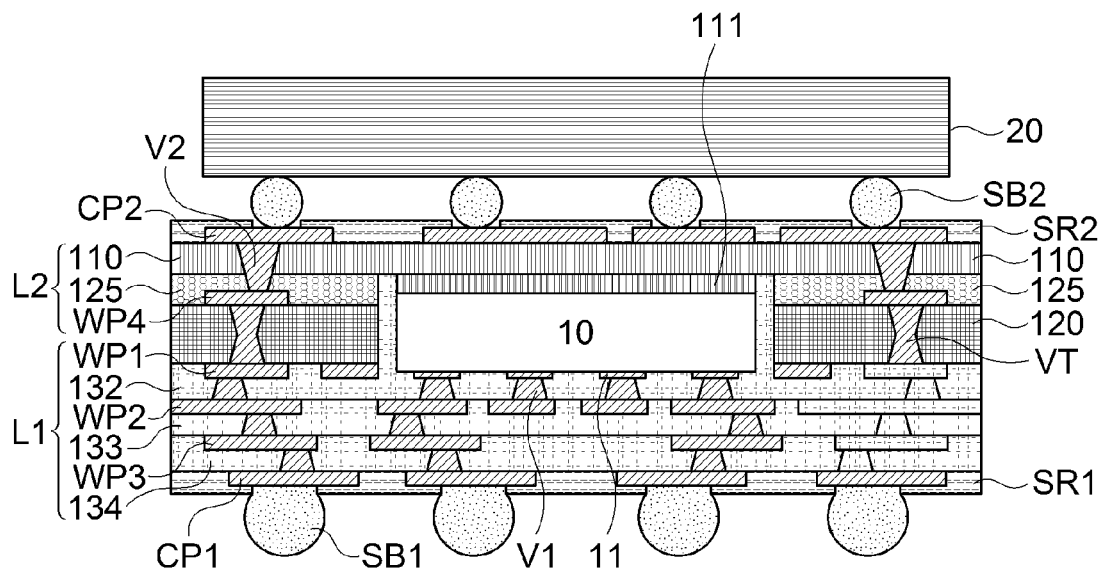
FIG. 3 is a cross-sectional view schematically showing an electronic component embedded substrate in accordance with another embodiment of the present invention.

FIG. 3 is a cross-sectional view schematically showing an electronic component embedded substrate 300 in accordance with another embodiment of the present invention.

Referring to FIG. 3, the electronic component embedded substrate 300 according to the present embodiment is different from the embodiment described above with reference to FIG. 1 in that a second contact pad CP2 is provided on an insulating substrate 110.

At this time, the second contact pad CP2 may be electrically connected to a fourth wiring pattern WP4 by a second via V2. Further, the second contact pad CP2 may be formed in the area between a chip component 20 and the insulating substrate 110.

Accordingly, when two or more external terminals are provided in the chip component 20, all of the external terminals of the chip component 20 can be electrically connected to the second contact pad CP2 and a so-called wide I/O structure can be implemented.

Meanwhile, a second solder resist SR2, which covers a portion of the second contact pad CP2 and the insulating substrate 110, may be further provided to reduce contamination or damage of the second contact pad CP2.

Further, a second solder ball SB2 may be provided between the second contact pad CP2 and the chip component 20 to implement electrical connection.

Figure 4:
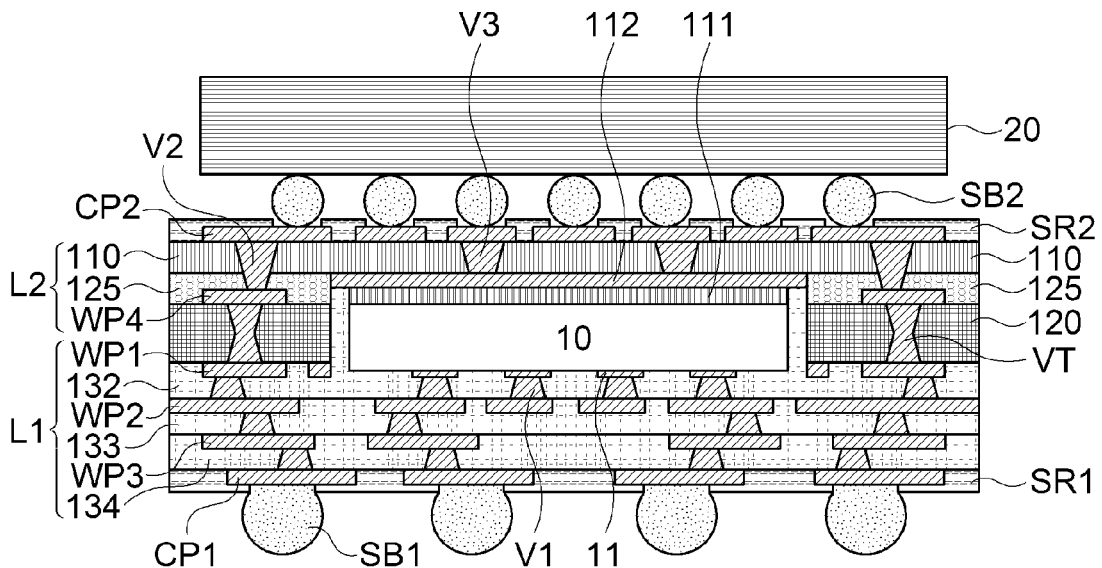
FIG. 4 is a cross-sectional view schematically showing an electronic component embedded substrate in accordance with another embodiment of the present invention.

FIG. 4 is a cross-sectional view schematically showing an electronic component embedded substrate 400 in accordance with another embodiment of the present invention.

Referring to FIG. 4, the electronic component embedded substrate 400 according to the present embodiment is different from the above-described embodiments in that a metal pattern 112 provided between an adhesive member 111 and an insulating substrate 110 is connected to a second contact pad CP2 provided on the insulating substrate 110 by a third via V3.

That is, in the embodiment described above with reference to FIG. 2, the first metal pattern 112 can perform only a heat radiation function, but the first metal pattern 112 according to the present embodiment can be electrically connected to an external terminal of a chip component 20 through a second solder ball SB2, the second contact pad CP2, and the third via V3.

Accordingly, it is possible to improve manufacturing efficiency and connection reliability by dispersing wiring using the first metal pattern 112 when many external terminals are provided in the chip component 20 and thus it is difficult to implement wiring connection only by the second contact pad CP2.

Figure 5:
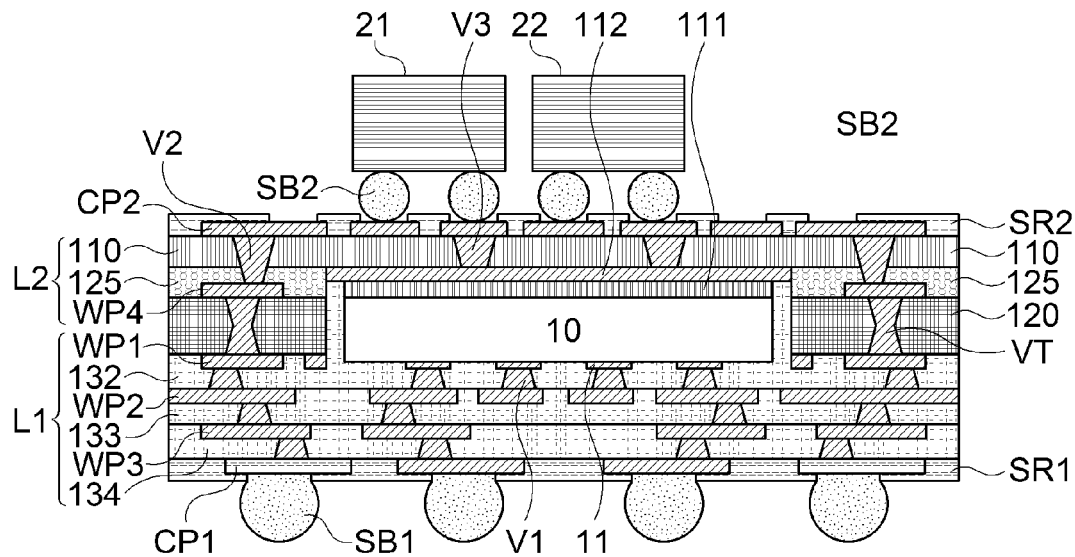
FIG. 5 is a cross-sectional view schematically showing an electronic component embedded substrate in accordance with another embodiment of the present invention.

FIG. 5 is a cross-sectional view schematically showing an electronic component embedded substrate 500 in accordance with another embodiment of the present invention.

Referring to FIG. 5, the electronic component embedded substrate 500 is different from the above-described embodiments in that a plurality of chip components 21 and 22 are mounted outside an insulating substrate 110.

At this time, the chip components 21 and 22 may be selected from various components such as memory chips, active devices, and passive devices.

Further, at least one of the chip components 21 and 22 may be positioned vertically above the electronic component 10 to be electrically connected by a second solder ball SB2, a second contact pad CP2, etc.

Figure 6:
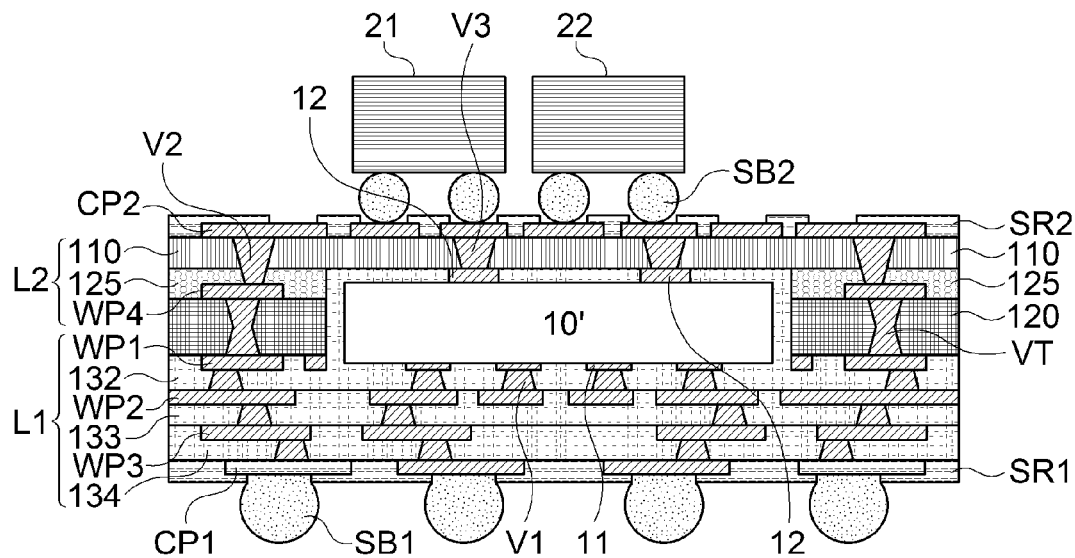
FIG. 6 is a cross-sectional view schematically showing an electronic component embedded substrate in accordance with another embodiment of the present invention.

FIG. 6 is a cross-sectional view schematically showing an electronic component embedded substrate 600 in accordance with another embodiment of the present invention.

Referring to FIG. 6, the electronic component embedded substrate 600 is different from the above-described embodiments in that an electronic component 10' having a first external terminal 11 on one surface and a second external terminal 12 on the other surface is embedded.

However, in this case, the number of the second external terminals 12 may be less than the number of the first external terminals 11, and the wiring density of a second wiring layer L2 may be lower than that of a first wiring layer L1.

Meanwhile, in the present embodiment, external terminals of chip components 21 and 22 are in contact with a second solder ball SB2, and the second solder ball SB2 is connected to a second contact pad CP2. At this time, the second contact pad CP2 and the second external terminal 12 may be directly connected by a third via V3.

Accordingly, the signal transmission path between the chip component 20 and the electronic component 10' can be remarkably reduced. As a result, the data transmission speed between the chip component 20 and the electronic component 10' may be maximized. For example, when the chip component 20 is a memory chip and the electronic component 10' is an AP, as the data transmission speed between the AP and the memory chip is improved, the function of the AP can be more sufficiently utilized.

Figure 7:
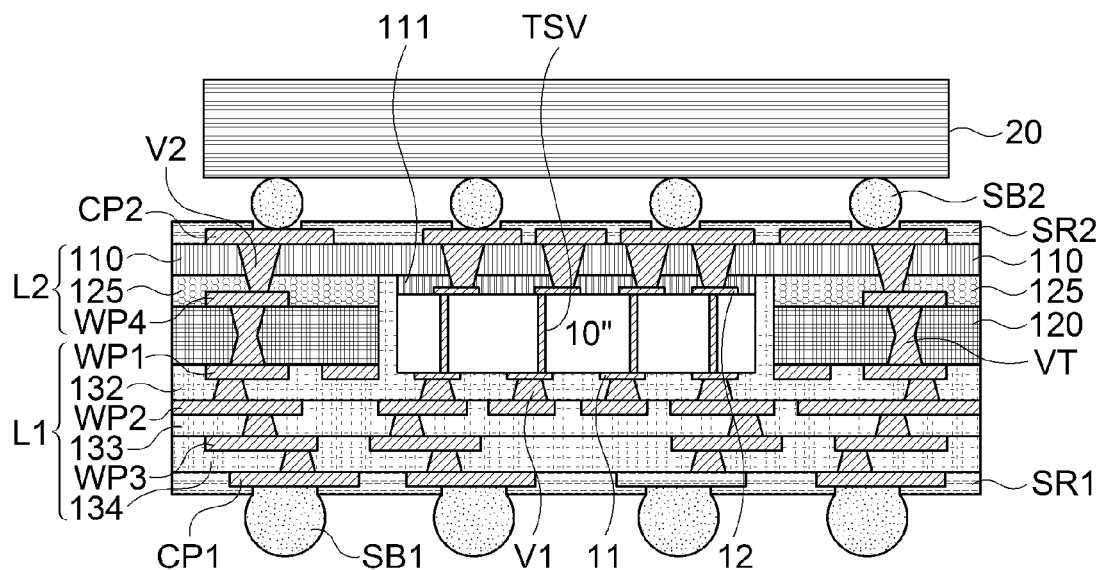
FIG. 7 is a cross-sectional view schematically showing an electronic component embedded substrate in accordance with another embodiment of the present invention.

FIG. 7 is a cross-sectional view schematically showing an electronic component embedded substrate 700 in accordance with another embodiment of the present invention.

Referring to FIG. 7, the electronic component embedded substrate 700 according to the present embodiment is different from the above-described embodiments in that an electronic component 10" having a through silicon via TSV for connecting at least a portion of a first external terminal 11 and at least a portion of a second external terminal 12 while having the first external terminal 11 on one surface and the second external terminal 12 on the other surface is embedded.

At this time, a second contact pad CP2 may be electrically connected to a fourth wiring pattern WP4 by a second via V2. Further, the second contact pad CP2 may be also formed in the area between a chip component 20 and an insulating substrate 110.

Further, the second contact pad CP2 and the second external terminal 12 may be electrically connected by a third via V3. Here, the third via V3 passes through the insulating substrate 110 and an adhesive member 111 and may be implemented by a typical laser via forming method.

Accordingly, the chip component 20 and the electronic component 10" can be directly connected by a very short path through a second solder ball SB2, the second contact pad CP2, and the third via V3. As a result, the signal transmission speed between the chip component 20 and the electronic component 10" can be significantly improved.

Further, as the second contact pad CP2 and the second external terminal 12 are directly connected by the third via V3, since the signal transmission path can be implemented with the same conductive material, for example, Cu—Cu connection, interconnection characteristics can be further improved.

Meanwhile, in the electronic component embedded substrate 700 according to the present embodiment, since a plurality of second external terminals 12 intervene in the contact between the electronic component 10" and the adhesive member 111, it is needed to implement the adhesive member 111 with a material having a predetermined flowability. As an example, an epoxy chip adhesive may be used to implement the adhesive member 111.

Figure 8:
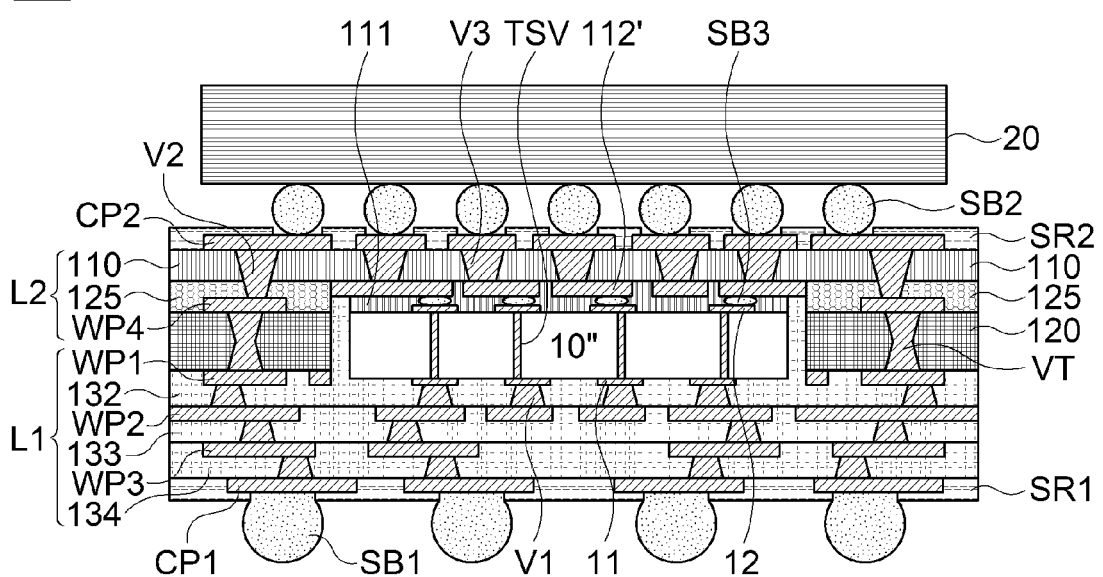
FIG. 8 is a cross-sectional view schematically showing an electronic component embedded substrate in accordance with another embodiment of the present invention.

FIG. 8 is a cross-sectional view schematically showing an electronic component embedded substrate 800 in accordance with another embodiment of the present invention.

Referring to FIG. 8, the electronic component embedded substrate 800 according to the present embodiment is different from the above-described embodiments in that an electronic component 10" having a through silicon via TSV for connecting at least a portion of a first external terminal 11 and at least a portion of a second external terminal 12 while having the first external terminal 11 on one surface and the second external terminal 12 on the other surface is embedded and first metal patterns 112' provided between an adhesive member 111 and an insulating substrate 110 are connected to the second external terminals 12 by third solder balls SB3, respectively.

That is, in the embodiment described above with reference to FIG. 5, it was possible to disperse wiring using the first metal pattern 112 by electrically connecting the first metal pattern 112 to the external terminal of the chip component 20 through the second solder ball SB2, the second contact pad CP2, and the third via V3.

In the present embodiment, going one step further, the first metal patterns 112' disperse wiring and the chip component 20 and the electronic component 10" can be directly connected by a short path through the second solder ball SB2, the second contact pad CP2, the third via V3, the first metal pattern 112', and the third solder ball SB3.

Accordingly, the signal transmission speed between the chip component 20 and the electronic component 10" can be remarkably improved.

Further, the electronic component embedded substrate 800 according to the present embodiment has advantages that the first metal patterns 112' are used as the connection path between the chip component 20 and the electronic component 10" and it is possible to disperse wiring using the first metal patterns 112' even when there are many external terminals of the chip component 20.

However, in the electronic component embedded substrate 800 according to the present embodiment, since the first metal patterns 112' and the second external terminal 12 are connected by the third solder ball SB3, interconnection reliability may be slightly deteriorated compared to the embodiment shown in FIG. 7.

Further, as the first metal patterns 112' and the second external terminals 12 get smaller, since a soldering process should be performed using a smaller solder ball, the risk of connection failure may be slightly increased compared to the embodiment shown in FIG. 7.

Meanwhile, in the electronic component embedded substrate 800 according to the present embodiment, the adhesive member 111 covers the first metal patterns 112' in a state in which the first metal patterns 112' are formed on the surface of the insulating substrate 110. Accordingly, the adhesive member 111 performs a function of fixing the electronic component 10" while securing insulating properties.

Therefore, in the present embodiment, a material for implementing the adhesive member 111 is needed to have a predetermined flowability. As an example, an epoxy chip adhesive may be used to implement the adhesive member 111.

Figure 9:
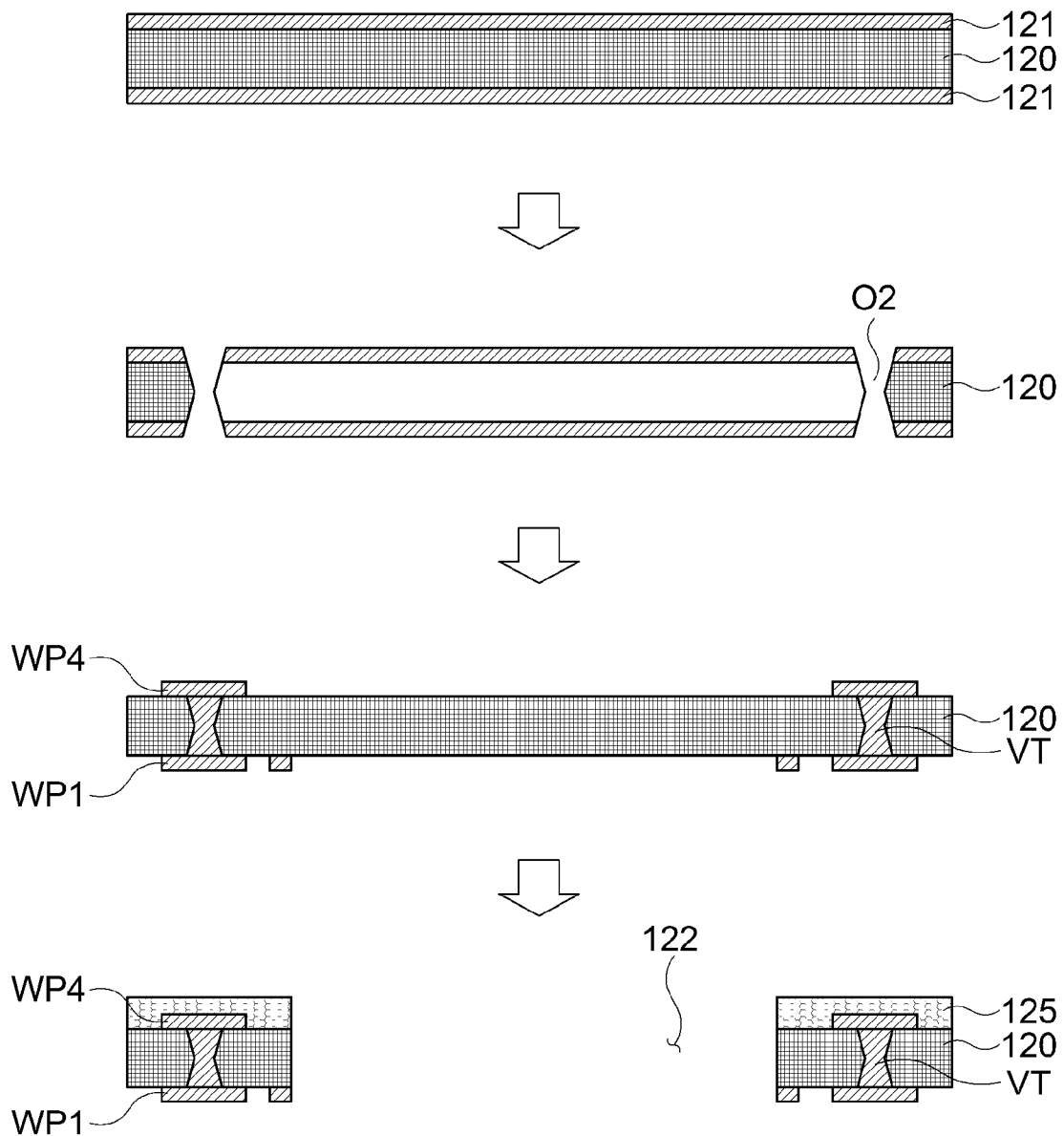
FIG. 9 is a process cross-sectional view for explaining a method for manufacturing an electronic component embedded substrate in accordance with an embodiment of the present invention.

FIG. 9 is a process cross-sectional view for explaining a method for manufacturing an electronic component embedded substrate in accordance with an embodiment of the present invention.

Referring to FIG. 9, it will be understood that a through via VT is implemented by forming a second opening O2 in a first insulating layer 120 and a first wiring pattern WP1 formed on one surface of the first insulating layer 120 and a second wiring pattern WP2 formed on the other surface of the first insulating layer 120 are connected by the through via VT.

Further, a cavity 122 may be formed in the first insulating layer 120 to accommodate an electronic component 10 therein.

At this time, the cavity 122 may be formed in a state in which a fifth insulating layer 125 covering a fourth wiring pattern WP4 is formed. The fifth insulating layer 125 formed in this way may be in contact with an insulating substrate 110.

Meanwhile, the first insulating layer 120 may be a core substrate made of a high rigidity material. Hereinafter, the first insulating layer 120 will be referred to as the core substrate.

Further, the core substrate may have a metal material 121 such as copper foil on the surface of an insulating material. As an example, a copper clad laminate (CCL) may be used as the core substrate.

FIGS. 10a to 10i are process cross-sectional views for explaining the method for manufacturing an electronic component embedded substrate in accordance with an embodiment of the present invention.

Figure 10A:
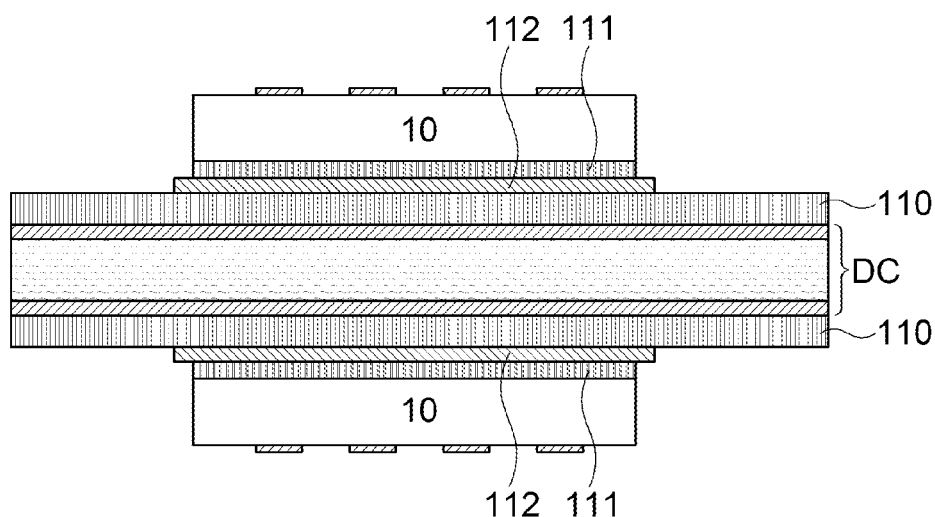

First, referring to FIG. 10a, the electronic component 10 may be disposed on the insulating substrate 110.

At this time, the electronic component 10 may have a plurality of first external terminals 11 on one surface thereof and may be coupled so that the surface opposite to the surface having the first external terminals 11 thereon faces the insulating substrate 110.

Further, an adhesive member 111 may be further provided between the electronic component 10 and the insulating substrate 110 to firmly couple the electronic component 10.

Further, the adhesive member 111 may be in contact with a first metal pattern 112 in a state in which the first metal pattern 112 is formed on the surface of the insulating substrate 110.

Meanwhile, FIGS. 10A to 10f show that a manufacturing process of an electronic component embedded substrate 100 can be performed symmetrically on both surfaces of a detach core (DC) using the DC.

When the manufacturing process is performed on the both surfaces of the DC like this, it is advantageous to reduction of warpage generated in the manufacturing process.

Figure 10B:
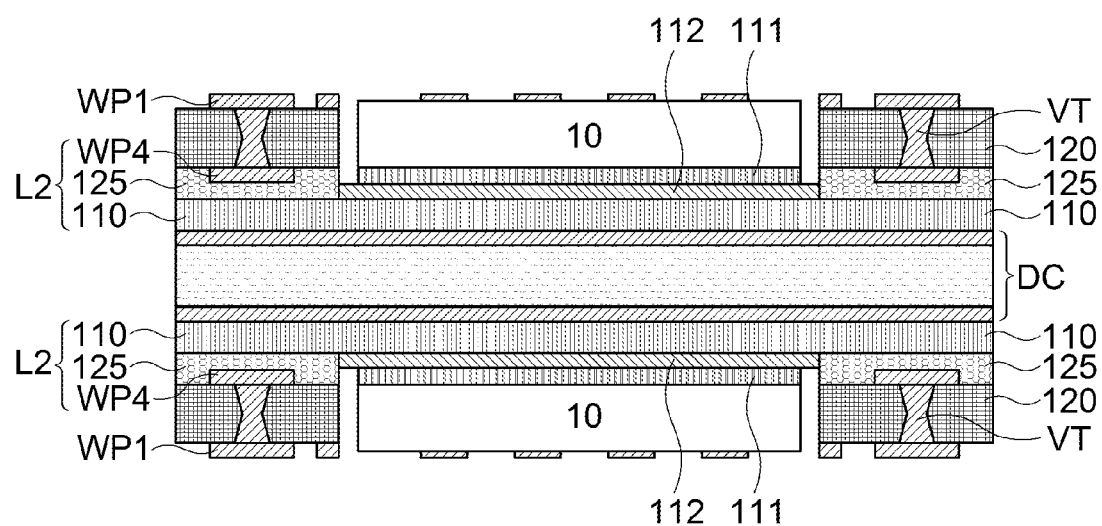

Next, referring to FIG. 10B, the core substrate may be coupled to the insulating substrate 110 so that the electronic component 10 can be inserted in the cavity 122.

Figure 10C:
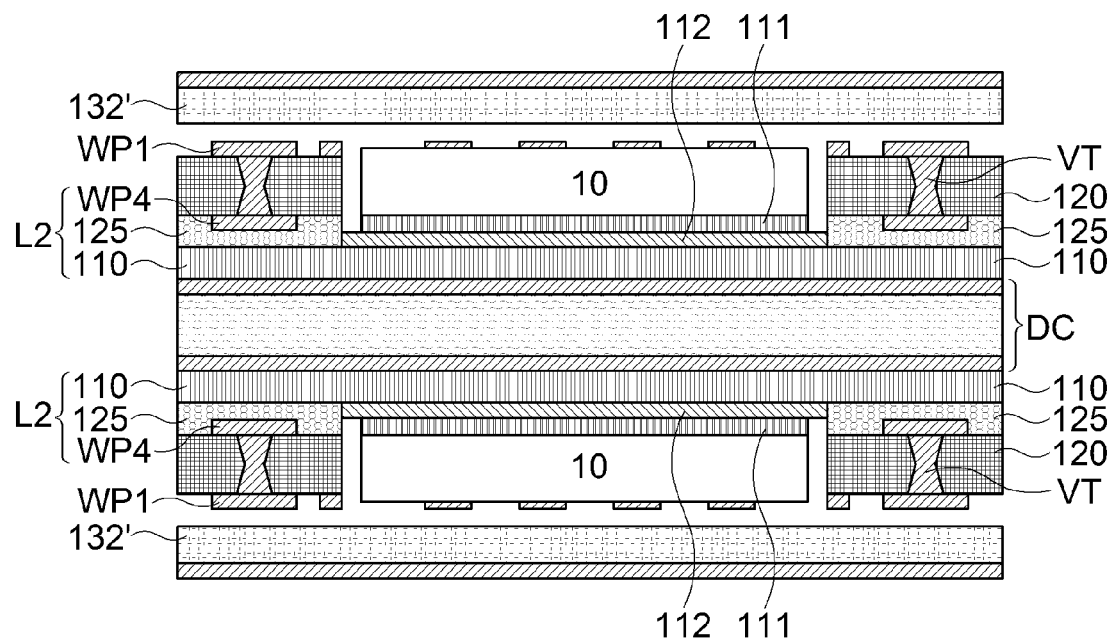

Next, referring to FIG. 10C, an insulating material 132' may be provided on the core substrate and the electronic component 10, and the insulating material 132' provided like this forms a second insulating layer 132 which covers the core substrate, the first wiring pattern WP1, the electronic component 10, and the first external terminal 11. The insulating material 132' provided herein may be filled in the space between the electronic component 10 and the cavity 122 and perform a function of firmly fixing the electronic component 10.

Further, the insulating material 132' may be prepreg (PPG) and have a metal material on one surface thereof.

Figure 10D:
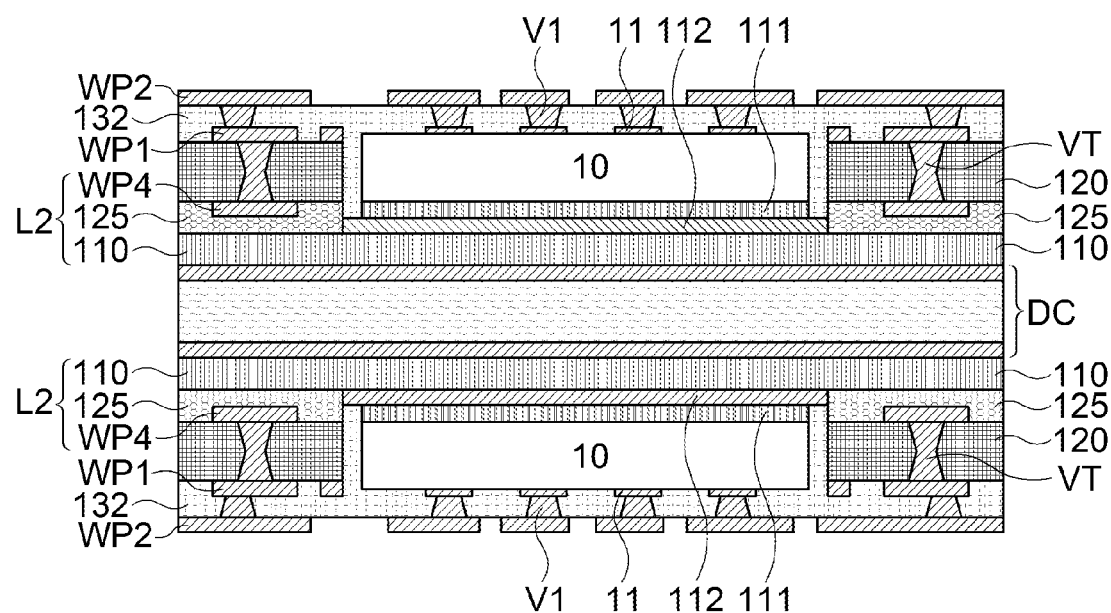

Next, referring to FIG. 10D, the second wiring pattern WP2 may be formed on the second insulating layer 132. At this time, a first via V1 may be provided so that the second wiring pattern WP2 can be electrically connected to the first wiring pattern WP1 and the first external terminal 11.

Figure 10E:
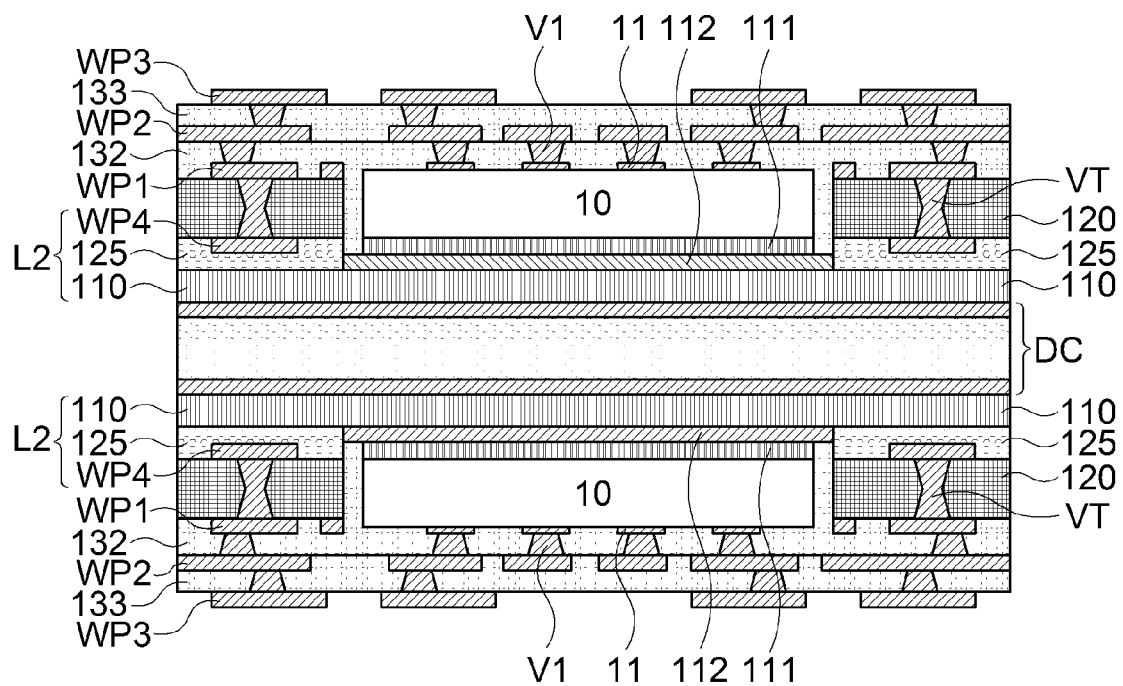
Figure 10F:
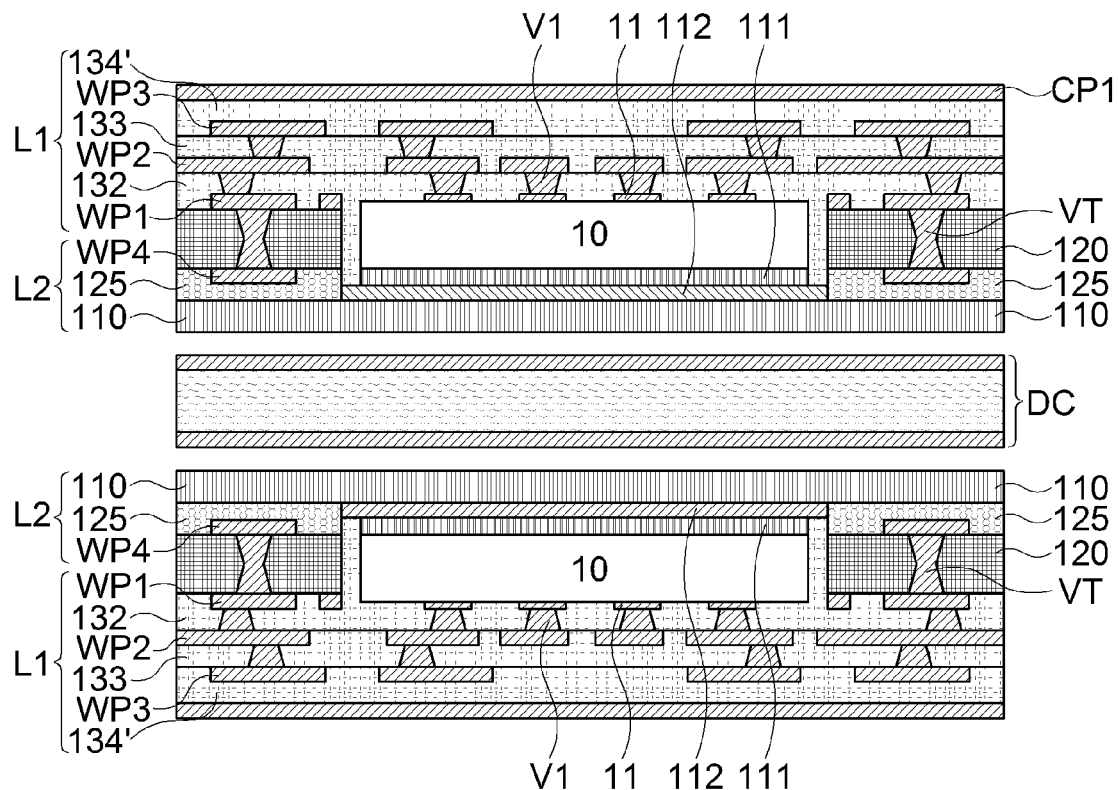

Next, FIG. 10E is a process cross-sectional view showing the state in which a third insulating layer 133 and a third wiring pattern WP3 are formed, and FIG. 10f is a process cross-sectional view showing the state in which a fourth insulating layer 134 is formed.

Referring to FIGS. 10E and 10F, it will be understood that at least one build-up layer can be formed on the second insulating layer 132.

Meanwhile, an individual process can be performed after separating a laminate positioned on the DC and a laminate positioned under the DC by removing the DC in a state in which the fourth insulating layer 134 is formed.

Figure 10G:
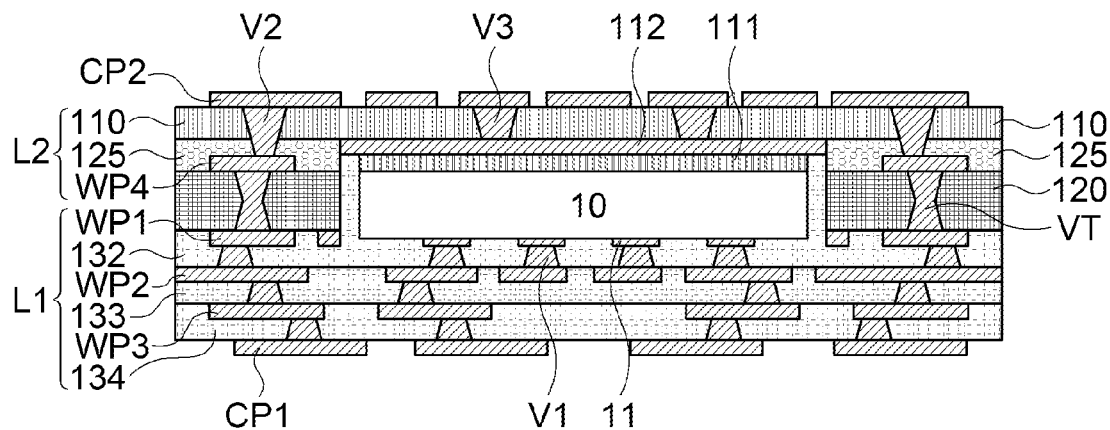

Next, referring to FIG. 10G, a contact pad may be formed on an outer surface of the build-up layer. That is, a first contact pad CP1 may be formed on an outer surface of the fourth insulating layer 134, and a second contact pad CP2 may be formed on an outer surface of a fifth insulating layer 125.

Figure 10H:
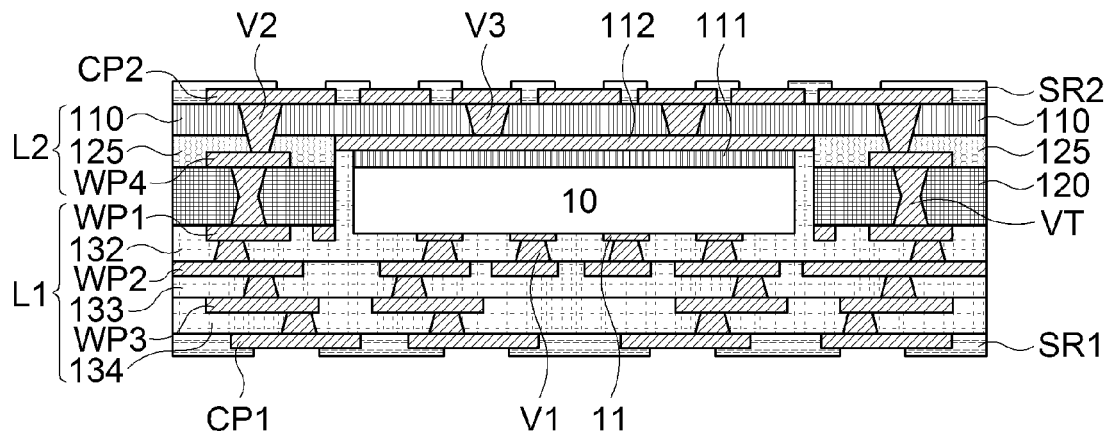

Next, referring to FIG. 10H, a first solder resist SR1, which covers the first contact pad CP1 and the fourth insulating layer 134 while exposing a portion of the first contact pad CP1, may be formed.

Further, a second solder resist SR2, which covers the second contact pad CP2 and the fifth insulating layer 125 while exposing a portion of the second contact pad CP2, may be formed.

Figure 10I:
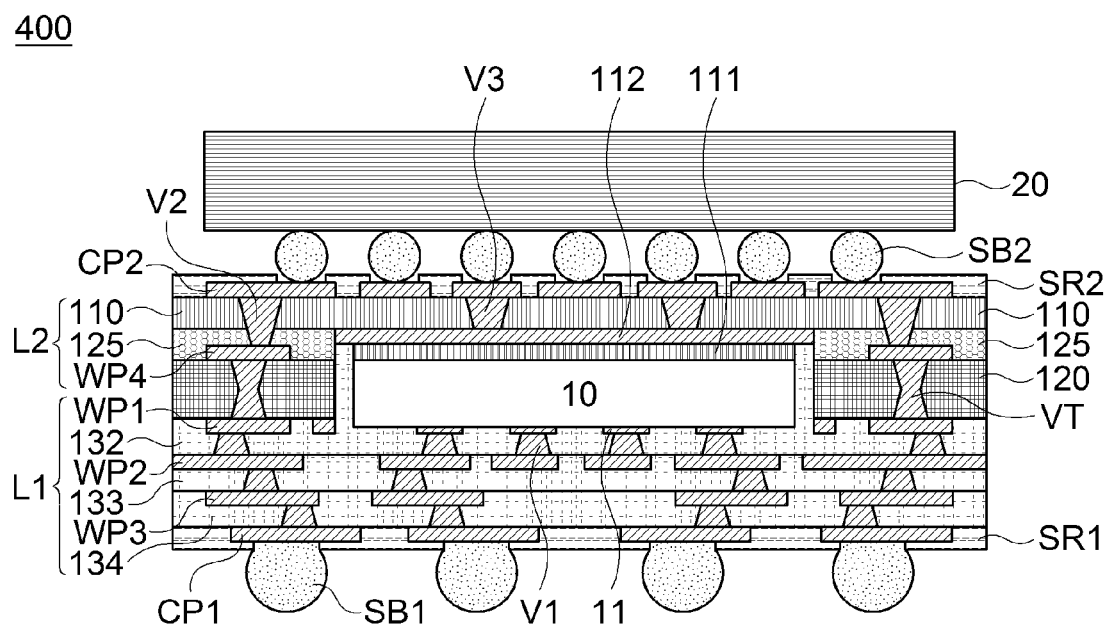

Next, referring to FIG. 10I, a chip component 20 may be further provided to be electrically connected through the second contact pad CP2.

Meanwhile, it is preferred that the insulating substrate 110 is made of a material having a higher coefficient of thermal expansion than the second insulating layer 132 to reduce the warpage of the entire electronic component embedded substrate while allowing wirings connected to the first external terminals 11 of the electronic component 10 to have a high wiring density.

According to the embodiment of the present invention configured as above, it is possible to minimize unnecessary wiring while reducing warpage of an electronic component embedded substrate.

What is claimed is:

1. An electronic component embedded substrate comprising:
   an electronic component comprising a first surface having first external terminals thereon and a second surface opposite the first surface and made of an insulating material;
   a first wiring layer provided on the first surface and comprising a first wiring portion electrically connected to the first external terminal and a first insulating portion; and
   a second wiring layer provided on the second surface and comprising a second wiring portion and a second insulating portion, wherein at least one of the number of layers and wiring density of the first wiring layer is greater than at least one of the number of layers and wiring density of the second wiring layer, respectively, and the first insulating portion is made of a material having a lower coefficient of thermal expansion than the second insulating portion.

2. The electronic component embedded substrate according to claim 1, further comprising:
   a first insulating layer comprising a cavity to insert a portion of the electronic component therein and made of an insulating material.

3. The electronic component embedded substrate according to claim 2, wherein the first insulating layer is a core substrate.

4. The electronic component embedded substrate according to claim 3, further comprising:
   a through via passing through the first insulating layer to electrically connect the first wiring layer and the second wiring layer.

5. The electronic component embedded substrate according to claim 1, wherein a first contact pad is further provided on an outer surface of the first wiring layer to be electrically connected to the first wiring portion.

6. The electronic component embedded substrate according to claim 5, wherein a first solder resist is further provided on the outer surface of the first wiring layer to expose the first contact pad to the outside.

7. The electronic component embedded substrate according to claim 1, further comprising:
an adhesive member in contact with the second surface of the electronic component.

8. The electronic component embedded substrate according to claim 7, further comprising:
a first metal pattern provided on an outer surface of the adhesive member.

9. The electronic component embedded substrate according to claim 1, further comprising:
a chip component provided on the second wiring layer to be electrically connected to the second wiring layer.

10. The electronic component embedded substrate according to claim 9, wherein the chip component is a memory chip, and the electronic component is an integrated circuit.

11. The electronic component embedded substrate according to claim 9, wherein a second contact pad is further provided on an outer surface of the second wiring layer to be electrically connected to the second wiring portion.

12. The electronic component embedded substrate according to claim 11, further comprising:
a solder ball for electrically connecting the second contact pad and the chip component.

13. The electronic component embedded substrate according to claim 12, wherein the solder ball is provided vertically above or below the electronic component.

14. The electronic component embedded substrate according to claim 11, wherein a second solder resist is further provided on the outer surface of the second wiring layer to expose the contact pad to the outside.

15. An electronic component embedded substrate comprising:
an electronic component comprising a first surface having first external terminals thereon and a second surface opposite to the first surface and having a second external terminal thereon;
a first wiring layer provided on the first surface and comprising a first wiring portion electrically connected to the first external terminal and a first insulating portion; and
a second wiring layer provided on the second surface and comprising a second wiring portion electrically connected to the second external terminal and a second insulating portion, wherein the number of second external terminals is less than the number of the first external terminals, at least one of the number of layers and wiring density of the first wiring layer is greater than at least one of the number of layers and wiring density of the second wiring layer, respectively, and the first insulating portion is made of a material having a lower coefficient of thermal expansion than the second insulating portion.

16. The electronic component embedded substrate according to claim 15, further comprising:
a chip component provided on the second wiring layer to be electrically connected to the second wiring layer.

17. The electronic component embedded substrate according to claim 16, wherein the chip component is a memory chip, and the electronic component is an integrated circuit.

18. The electronic component embedded substrate according to claim 16, wherein a second contact pad is further provided on an outer surface of the second wiring layer to be electrically connected to the second wiring portion.

19. The electronic component embedded substrate according to claim 18, further comprising:
a solder ball for electrically connecting the second contact pad and the chip component.

20. The electronic component embedded substrate according to claim 19, wherein the solder ball is provided vertically above or below the electronic component.

21. The electronic component embedded substrate according to claim 18, further comprising:
a second solder resist provided on the outer surface of the second wiring layer to expose the second contact pad to the outside.

22. The electronic component embedded substrate according to claim 15, wherein the first external terminal and the second external terminal are electrically connected by a through silicon via (TSV) passing through the electronic component.

23. The electronic component embedded substrate according to claim 22, wherein the second wiring layer comprises a via having one surface in contact with the second external terminal.

24. The electronic component embedded substrate according to claim 23, further comprising:
a second contact pad provided on the outer surface of the second wiring layer to be in contact with the other surface of the via; and a chip component electrically connected to the second contact pad by the solder ball.

25. The electronic component embedded substrate according to claim 22, further comprising:
an adhesive member in contact with the second surface of the electronic component; first metal patterns provided on an outer surface of the adhesive member; a via having one surface in contact with each of the first metal patterns;
a second contact pad in contact with the other surface of the via; and a chip component electrically connected to the second contact pad by the solder ball, wherein the first metal patterns and the second external terminal are electrically connected by a second solder ball.

26. A method for manufacturing an electronic component embedded substrate, comprising:
providing a core substrate which is penetrated by a cavity, has a first wiring pattern on one surface thereof, has a fourth wiring pattern on an other surface thereof, and electrically connects the first wiring pattern and the fourth wiring pattern by a through via;
coupling the other surface of an electronic component having first external terminals on the one surface thereof to an insulating substrate;
coupling the core substrate to the insulating substrate to insert the electronic component in the cavity;
forming a second insulating layer on the core substrate and the electronic component;
forming first vias which are in contact with the first wiring pattern and one of the first external terminals through the second insulating layer, respectively; and
forming a second wiring pattern on the second insulating layer, wherein a coefficient of thermal expansion of the insulating substrate is higher than that of the second insulating layer.

27. The method for manufacturing an electronic component embedded substrate according to claim 26, further comprising:
forming one build-up layer on the second insulating layer; and forming a first contact pad on an outer surface of the build-up layer.

28. The method for manufacturing an electronic component embedded substrate according to claim 26, wherein coupling the other surface of the electronic component having the first external terminals on one surface thereof to the insulating substrate is performed to couple the insulating substrate and the electronic component in a state in which an adhesive member is formed on the other surface of the electronic component.

29. The method for manufacturing an electronic component embedded substrate according to claim 26, wherein coupling the other surface of the electronic component having the first external terminals on one surface thereof to the insulating substrate is performed to make a first metal pattern and an adhesive member in contact with each other in a state in which the first metal pattern is formed on the insulating substrate and the adhesive member is formed on the other surface of the electronic component.

30. The electronic component embedded substrate according to claim 15, further comprising a first via directly connecting a second contact pad and the second external terminal, and electrically connecting the second wiring pattern with the first wiring pattern and the first external terminal; a second via connecting the second contact pad to a fourth wiring pattern, and a third via directly connecting the second contact pad with the second external terminal, wherein the second contact pad is disposed on an outer surface of the second wiring layer and electrically connected to the second wiring, the fourth wiring pattern is disposed on an other surface of the first wiring pattern; and the first via, the second via, and the third via comprise non uniform cross sectional areas that decrease as the first via, the second via, and the third via extend toward the electronic component, and a height of the second via is larger than a height of the third via and a height of the first via.

31. The electronic component embedded substrate according to claim 15, wherein the first insulation portion has a same length as that of the second insulation portion, the first insulation portion has a larger length compared to that of the electronic component, and the first insulation portion extends from a side of the second wiring portion to an other side of the second wiring portion, and the first surface and the second surface are parallel to each other.

* * * * *